US012696382B2

(12) United States Patent
Wang et al.

(10) Patent No.: US 12,696,382 B2
(45) Date of Patent: Jul. 28, 2026

(54) FLEXIBLE CIRCUIT BOARD AND DISPLAY MODULE

(71) Applicants:Chengdu BOE Optoelectronics Technology Co., Ltd., Chengdu (CN); BOE Technology Group Co., Ltd., Beijing (CN)

(72) Inventors: Jiahua Wang, Beijing (CN); Hao Cheng, Beijing (CN); Jianjun Wu, Beijing (CN); Qiang Fan, Beijing (CN); Xin Bi, Beijing (CN); Jingchang Su, Beijing (CN); Wen Huang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 193 days.

(21) Appl. No.: 18/577,280

(22) PCT Filed: May 23, 2022

(86) PCT No.: PCT/CN2022/094438
§ 371 (c)(1),
(2) Date: Jan. 8, 2024

(87) PCT Pub. No.: WO2023/225790
PCT Pub. Date: Nov. 30, 2023

(65) Prior Publication Data
US 2024/0251501 A1       Jul. 25, 2024

(51) Int. Cl.
*H05K 1/02*                    (2006.01)

(52) U.S. Cl.
CPC ......... *H05K 1/0259* (2013.01); *H05K 1/0204* (2013.01); *H05K 1/028* (2013.01); *H05K 2201/10128* (2013.01)

(58) Field of Classification Search
CPC ...... H05K 1/02; H05K 1/0259; H05K 1/0204; H05K 1/028; H05K 2201/10128;
(Continued)

(56) References Cited

U.S. PATENT DOCUMENTS 8,035,298 B2 * 10/2011 Jeong ................... H10K 59/131
                                                          345/82
8,633,575 B1 * 1/2014 Mangrum ......... H01L 23/49838
                                                          257/676
(Continued)

FOREIGN PATENT DOCUMENTS

CN            2747819 Y      12/2005
CN         103140016 A        6/2013
(Continued)

OTHER PUBLICATIONS

International Search Report and Written Opinion mailed on Jan. 28, 2023, in corresponding PCT/CN2022/094438, 10 pages.
(Continued)

*Primary Examiner* — Danny Nguyen
(74) *Attorney, Agent, or Firm* — XSENSUS LLP

(57)                    ABSTRACT

A flexible circuit board and a display module are provided. The flexible circuit board includes: a flexible substrate having a chip binding region; a driving chip, arranged in the chip binding region of the flexible substrate; and a protective layer, arranged on a side of the driving chip away from the flexible substrate, where the protective layer includes an electrostatic discharge layer, an orthographic projection of the electrostatic discharge layer on the flexible substrate at
(Continued)

least partially overlaps with an orthographic projection of the driving chip on the flexible substrate.

19 Claims, 8 Drawing Sheets

(58) Field of Classification Search
     CPC .......... H05K 1/189; H05K 5/03; G06F 3/045; G09G 3/36
     USPC ................................................. 361/212, 220
     See application file for complete search history.

(56) References Cited

U.S. PATENT DOCUMENTS

| | | | | | |
|---|---|---|---|---|---|
| 8,922,970 | B2 * | 12/2014 | Hebert | ...................... | B64C 1/12 |
| | | | | | 361/216 |
| 9,380,688 | B1 * | 6/2016 | Feng | ......................... | H05F 3/04 |
| 11,204,659 | B2 | 12/2021 | Xu et al. | | |
| 11,348,882 | B2 * | 5/2022 | Aleksov | .................. | H01L 23/60 |
| 2008/0158766 | A1 * | 7/2008 | Oyama | .................. | H05K 1/026 |
| | | | | | 361/220 |
| 2009/0262094 | A1 * | 10/2009 | Lin | ......................... | H05K 1/026 |
| | | | | | 345/174 |
| 2012/0113073 | A1 * | 5/2012 | Yang | .................. | G02F 1/13452 |
| | | | | | 345/205 |
| 2012/0319932 | A1 * | 12/2012 | Li | ......................... | G09G 3/3685 |
| | | | | | 345/87 |
| 2016/0044815 | A1 * | 2/2016 | Kim | .................. | G02F 1/133308 |
| | | | | | 361/752 |
| 2020/0176487 | A1 | 6/2020 | Zhai | | |
| 2021/0132718 | A1 | 5/2021 | Xu et al. | | |
| 2021/0195812 | A1 | 6/2021 | Kim et al. | | |
| 2023/0209793 | A1 * | 6/2023 | Shin | .................. | G02F 1/133331 |
| | | | | | 361/220 |

FOREIGN PATENT DOCUMENTS

| | | | |
|---|---|---|---|
| CN | 103781327 | A | 5/2014 |
| CN | 103781327 | B | 8/2016 |
| CN | 106604533 | A | 4/2017 |
| CN | 106604533 | B | 8/2019 |
| CN | 110677982 | A | 1/2020 |
| CN | 111556648 | A | 8/2020 |
| CN | 211457500 | U | 9/2020 |
| CN | 212966870 | U | 4/2021 |
| CN | 113097252 | A | 7/2021 |
| CN | 113506795 | A | 10/2021 |
| CN | 113948563 | A | 1/2022 |
| CN | 111556648 | B | 4/2022 |
| CN | 114335092 | A | 4/2022 |

OTHER PUBLICATIONS

The First Office Action mailed Mar. 21, 2026, in Chinese Application No. 202280001367.8, 20 pages including English translation.

* cited by examiner 311          310

311          310

FLEXIBLE CIRCUIT BOARD AND DISPLAY MODULE

CROSS-REFERENCE TO RELATED APPLICATION

The present disclosure is a U.S. National Stage of International Application No. PCT/CN2022/094438, filed on May 23, 2022, entitled "FLEXIBLE CIRCUIT BOARD AND DISPLAY MODULE", the entire content of which is incorporated herein by reference.

TECHNICAL FIELD

The present disclosure relates to a field of display technology, and more particularly to a flexible circuit board and a display module.

BACKGROUND

Electronic products, especially various wearable electronic products, such as watches, bracelets, etc., need to have a reliable electrostatic discharge (ESD) protective capability.

At present, when an ESD test is performed on an individual module of the electronic product, it often occurs that an IC driving chip is damaged by static electricity, resulting in abnormal display or inability to display due to light failure, or even directly leading to IC burns.

It should be noted that the information disclosed in this section is only for enhancing understanding of the BACKGROUND of the disclosure and therefore, may contain information that does not constitute the prior art that is already known to those skilled in the art.

SUMMARY

The present disclosure aims to provide a flexible circuit board and a display module, and the flexible circuit board has a good ESD protective capability and an electromagnetic shielding capability.

In order to achieve the purpose of the present disclosure, the following technical solutions are adopted in the present disclosure:

according to a first aspect of the present disclosure, a flexible circuit board is provided, including:

a flexible substrate having a chip binding region;

a driving chip, arranged in the chip binding region of the flexible substrate; and a protective layer, arranged on a side of the driving chip away from the flexible substrate, where the protective layer includes an electrostatic discharge layer, an orthographic projection of the electrostatic discharge layer on the flexible substrate at least partially overlaps with an orthographic projection of the driving chip on the flexible substrate.

In an exemplary embodiment of the present disclosure, the electrostatic discharge layer is provided with a first surface close to the flexible substrate, a second surface away from the flexible substrate and a heat dissipation channel running through the first surface and the second surface.

In an exemplary embodiment of the present disclosure, the electrostatic discharge layer is provided with a first surface close to the flexible substrate, a second surface far away from the flexible substrate, and a plurality of electrostatic discharge graphic units, the electrostatic discharge graphic unit includes at least two electrostatic discharge sharp corners, and a discharge channel is defined between the electrostatic discharge sharp corners and runs through the first surface and the second surface.

In an exemplary embodiment of the present disclosure, the electrostatic discharge graphic unit includes an even number of the electrostatic discharge sharp corners, and tips of each two electrostatic discharge sharp corners are arranged opposite each other.

In an exemplary embodiment of the present disclosure, the electrostatic discharge graphic unit includes a plurality of electrostatic discharge sharp corners, tips of the plurality of electrostatic discharge sharp corners of the electrostatic discharge graphic unit are connected to form an inner circle, and the plurality of electrostatic discharge sharp corners of the electrostatic discharge graphic unit are uniformly distributed in a circumferential direction on a periphery of the inner circle.

In an exemplary embodiment of the present disclosure, each electrostatic discharge sharp corner in the electrostatic discharge graphic unit is provided with a tip extending toward an interior of the electrostatic discharge channel, and a distance between tips of two adjacent or opposite electrostatic discharge sharp corners is 0.05 to 0.1 mm.

In an exemplary embodiment of the present disclosure, an orthographic projection of the electrostatic discharge sharp corner on the flexible substrate is an acute angle.

In an exemplary embodiment of the present disclosure, the protective layer further includes:

a buffer layer, arranged on a side of the electrostatic discharge layer away from the flexible substrate, where the buffer layer is defined with a through hole running through the buffer layer, an orthographic projection of the through hole on the flexible substrate and an orthographic projection of the discharge channel on the flexible substrate at least partially overlap.

In an exemplary embodiment of the present disclosure, a minimum distance between an edge of the orthographic projection of the through hole on the flexible substrate and an edge of the orthographic projection of the discharge channel on the flexible substrate is greater than or equal to 2 mm.

In an exemplary embodiment of the present disclosure, the protective layer further includes:

an electrostatic discharge column, connected to a side of the electrostatic discharge layer away from the flexible substrate, where the electrostatic discharge column is provided with a bottom end close to the flexible substrate and a pointy end away from the flexible substrate.

In an exemplary embodiment of the present disclosure, an orthographic projection of the pointy end of the electrostatic discharge column on a first plane is an acute angle, and the first plane is perpendicular to the flexible substrate.

In an exemplary embodiment of the present disclosure, the protective layer further includes:

a buffer layer, arranged on a side of the electrostatic discharge layer away from the flexible substrate, where the buffer layer is defined with an avoidance hole running through the buffer layer, an orthographic projection of a tip of the electrostatic discharge column on the flexible substrate is located within an orthographic projection of the avoidance hole on the flexible substrate.

In an exemplary embodiment of the present disclosure, a minimum distance between an edge of the orthographic projection of the avoidance hole on the flexible substrate and an edge of an orthographic projection of the bottom end of the electrostatic discharge column on the flexible substrate is greater than or equal to 2 mm.

In an exemplary embodiment of the present disclosure, the flexible substrate includes:

a base substrate;

a conductive layer, arranged on a side of the base substrate close to the protective layer; where the conductive layer includes a first pin and a second pin connected to each other, the first pin is grounded, and the second pin is configured to be connected to the electrostatic discharge layer; and an insulating film, arranged on a side of the conductive layer away from the base substrate, where the insulating film is located on a periphery of the driving chip.

In an exemplary embodiment of the present disclosure, the flexible circuit board further includes:

a conductive adhesive layer, arranged between the insulating film and the electrostatic discharge layer, and the electrostatic discharge layer and the second pin are connected through the conductive adhesive layer.

In an exemplary embodiment of the present disclosure, the protective layer further includes:

a release film, arranged on a side of the buffer layer away from the flexible substrate, where the release film covers a surface of the side of the buffer layer away from the flexible substrate.

According to a second aspect of the present disclosure, a display module is provided, and includes a display panel, a circuit board and the flexible circuit board according to the first aspect.

In an exemplary embodiment of the present disclosure, a display module includes a display panel, a circuit board and the flexible circuit board according to the first aspect:

where the first pin is connected to the circuit board, and the circuit board is provided with a ground end;

the conductive layer further includes a third pin connected to the display panel.

The protective layer of the flexible circuit board provided by the present disclosure is located on the side of the driving chip away from the flexible substrate, the protective layer includes the electrostatic discharge layer. The electrostatic discharge layer on the one hand may increase a discharge path of charge and reduce the risk of the driving chip being damaged by the static electricity, and on the other hand, the electrostatic shielding effect of the electrostatic discharge layer facilitates the shielding of the electromagnetic radiation from a high-frequency signal of the driving chip to the outside and facilitates the shielding of the electromagnetic interference of the external circuit to the driving chip, thus improving an ESD protective capability and an electromagnetic shielding capability of the flexible circuit board, and improving a product quality.

BRIEF DESCRIPTION OF THE DRAWINGS

The aforementioned and other features and advantages of the present disclosure will become more apparent by a detailed description of embodiments with reference to the accompanying drawings.

Figure 1:
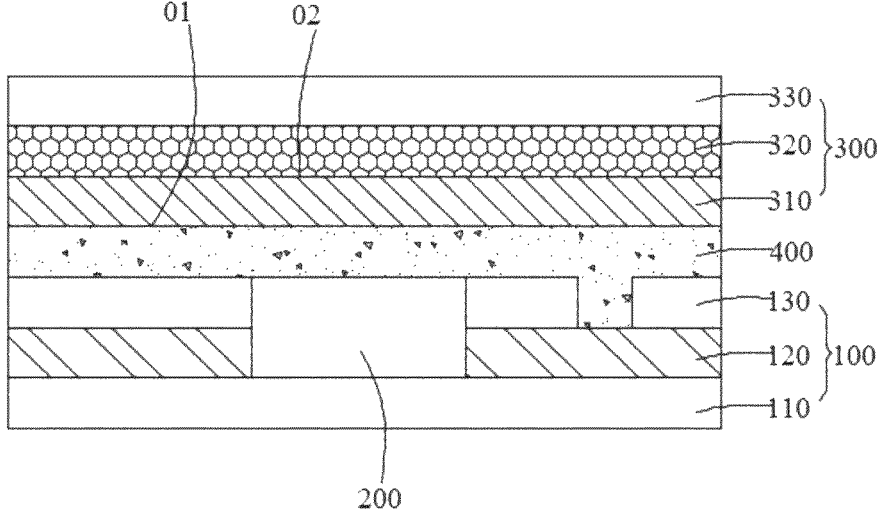
FIG. 1 is a schematic diagram of a stacked structure of a flexible circuit board in an exemplary embodiment of the present disclosure.

Reference numerals of main elements in the drawings are illustrated as follows:

100—flexible substrate; 110—base substrate; 120—conductive layer; 121—first pin; 122—second pin; 130—insulating film; 200—driving chip; 300—protective layer; 310—electrostatic discharge layer; 01—first surface; 02—second surface; 311—heat dissipation channel; 312—electrostatic discharge graphic unit; 3121—electrostatic discharge sharp corner; 3122—discharge channel; 313—electrostatic discharge column; 320—buffer layer; 321—through hole; 322—avoidance hole; 330—release film; 400—conductive adhesive layer; 10—display panel; 20—circuit board; 30—cover plate.

DETAILED DESCRIPTION

Example embodiments will now be described more fully with reference to the accompanying drawings. However, the example embodiments may be implemented in various forms, and should not be construed as being limited to the examples set forth herein; on the contrary, the provision of these embodiments makes the present disclosure more comprehensive and complete, and fully conveys the concept of the example embodiments to those skilled in the art. The described features, structures, or characteristics may be combined in one or more embodiments in any suitable manner. In the following description, many specific details are provided to give a sufficient understanding of the embodiments of the present disclosure.

In the drawings, the thickness of regions and layers may be exaggerated for clarity. The same reference numerals in the drawings indicate the same or similar structures, and thus their detailed descriptions will be omitted.

The described features, structures, or characteristics may be combined in one or more embodiments in any suitable manner. In the following description, many specific details are provided to give a sufficient understanding of the embodiments of the present disclosure. However, those skilled in the art will realize that the technical solutions of the present disclosure may be practiced without one or more of the specific details, or other methods, components, materials, etc. may be used. In other cases, well-known structures, materials, or operations are not shown or described in detail to avoid obscuring the main technical ideas of the present disclosure.

When a certain structure is "on" other structures, it may mean that the certain structure is integrally formed on other structures, or that the certain structure is "directly." arranged on other structures, or that the certain structure is "indirectly" arranged on other structures through another structure.

The terms "a", "an", and "the" are used to indicate the presence of one or more elements, components, etc. The terms "including" and "having" are used to indicate open-ended inclusion and mean that there may be additional elements, components, etc. in addition to the listed elements, components, etc. The terms "first" and "second" are only used as marks, and are not limited to the number of objects.

In the present disclosure, an acute angle, perpendicular, parallel and equal means that a corresponding structure is roughly in a state of acute angle or perpendicular, parallel, equal within an allowable error range in process, measurement, etc. The allowable error range in process and measurement may be determined by the actual operation, and for example, the error range may be less than or equal to +5%, but not limited to this.

In the relate art, in order to solve the problem of electro-static damage of various modules of the electronic product, usually, an external circuit board of a driving chip is optimized, an ESD protective module, such as a transient voltage suppressor (TVS) or magnetic beads, and other protective components, is added, and it is combined with technical means such as design optimization of an ESD protective module inside an IC driving chip for for electro-static protection. However, although this manner may improve the ESD problem to a certain extent, it still takes improving the external circuit board as an electrostatic protective path without considering that the static electricity directly damages the driving chip through an air discharge path.

Figure 2:
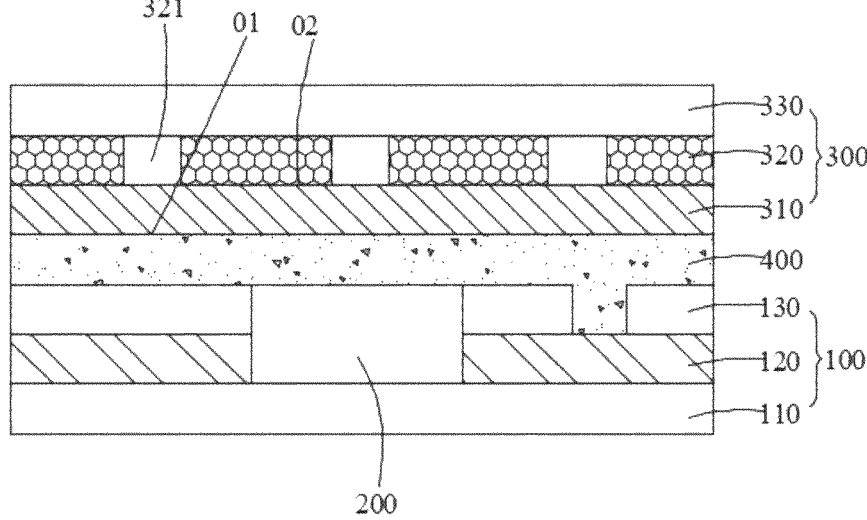
FIG. 2 is a schematic diagram of a stacked structure of a flexible circuit board in another exemplary embodiment of the present disclosure.
Figure 3:
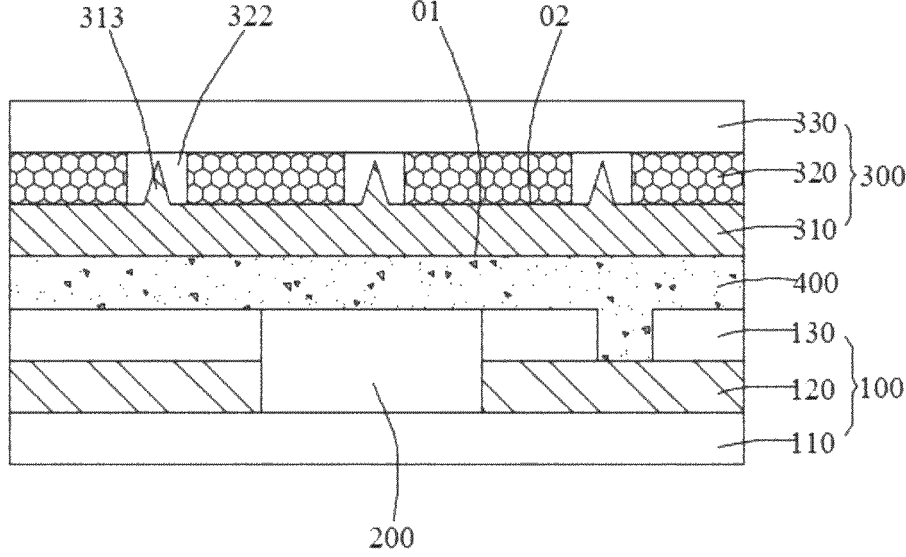
FIG. 3 is a schematic diagram of a stacked structure of a flexible circuit board in yet another exemplary embodiment of the present disclosure.

As shown in FIGS. 1 to 3, the present disclosure provides a flexible circuit board, including a flexible substrate 100, a driving chip 200 and a protective layer 300, where the flexible substrate 1 has a chip binding region, and the driving chip 200 is arranged in the chip binding region of the flexible substrate 100; the protective layer 300 is arranged on a side of the driving chip 200 away from the flexible substrate 100, the protective layer 300 includes an electrostatic discharge layer 310, an orthographic projection of the electrostatic discharge layer 310 on the flexible substrate 100 at least partially overlaps with an orthographic projection of the driving chip 200 on the flexible substrate 100.

For the flexible circuit board provided by the present disclosure, the protective layer 300 is arranged on the side of the driving chip 200 away from the flexible substrate 100, and the protective layer 300 includes an electrostatic discharge layer 310. The electrostatic discharge layer 310 on the one hand may increase a discharge path of charge and reduce the risk of the driving chip 200 being damaged by the static electricity, and on the other hand, the electrostatic shielding effect of the electrostatic discharge layer 310 facilitates the shielding of the electromagnetic radiation from a high-frequency signal of the driving chip 200 to the outside and facilitates the shielding of the electromagnetic interference of the external circuit to the driving chip 200, thus improving an ESD protective capability and an electromagnetic shielding capability of the flexible circuit board, and improving a product quality.

The following is a detailed description of various components of the flexible circuit board provided by the embodiments of the present disclosure in combination with the accompanying drawings:

As shown in FIGS. 1 to 3, the flexible circuit board provided by the present disclosure includes a flexible substrate 100, a driving chip 200 and a protective layer 300. The flexible circuit board may be applied to various electronic products, such as mobile phones, watches and bracelets. For example, the flexible circuit board may be connected to a display panel and a circuit board, an end of the flexible circuit board may be connected to the display panel and the other end of the flexible circuit board is connected to the external circuit board to form a display module.

In some embodiments of the present disclosure, the flexible substrate 100 may be a multi-layer structure, including a base substrate 110, a conductive layer 120 and an insulating film 130. The base substrate 110 is a flexible substrate, and its material may be PI (Polyimide), PA (Polyamide) or PBO (Poly-p-phenylene benzobisoxazole). The base substrate 110 may also be a composite of multiple layers of materials, and for example, in an embodiment of the present disclosure, the base substrate 110 may include a bottom film, a pressure sensitive adhesive layer, a first polyimide layer and a second polyimide layer, which are sequentially stacked.

The conductive layer 120 is arranged on a side of the base substrate 110 close to the protective layer 300. In practical applications, the conductive layer 120 may be configured to be connected with the display panel 10 and the circuit board. Specifically, the conductive layer 120 may be patterned using a patterning process to form a pattern connecting the display panel 10 and the circuit board. In addition, the conductive layer 120 may also be configured to be connected with the driving chip 200, such as connected with a pad of the driving chip 200. A material of the conductive layer 120 may be metal and alloy material, such as copper, and of course, it may also be another conductive material, which is not limited in the present disclosure.

The insulating film 130 is arranged on a side of the conductive layer 120 away from the base substrate 110. The insulating film 130 is located on a periphery of the driving chip 200 and covers most surface of the conductive layer 120 away from the base substrate 110, so as to protect the driving chip 200 and the conductive layer 120. The insulating film 130 may be a green oil protective layer, which may use a liquid photo solder resist, i.e. an acrylic oligomer, and may serve as a protective layer to coat the conductive layer 120 at a position where welding is not required, so as to protect a circuit pattern formed by the conductive layer 120.

The driving chip 200 is arranged in the chip binding region of the flexible substrate 100. The driving chip 200 may be connected to the display panel 10 to provide a driving signal for the display panel 10 and control a display screen of the display panel 10. There may be a plurality of driving chips 200, and different driving chips 200 may be connected to different structural layers of the display panel 10 to provide different driving signals.

The protective layer 300 is arranged on the side of the driving chip 200 away from the flexible substrate 100. An orthographic projection of the protective layer 300 on the flexible substrate 100 covers the orthographic projection of the driving chip 200 on the flexible substrate 100. The protective layer 300 includes an electrostatic discharge layer 310, which is conductive, and its material may be a conductive material with electrical conductivity, such as metal, alloy or indium tin oxide (ITO) and other transparent conductive material. In a specific embodiment, the electrostatic discharge layer 310 is a copper foil. During the ESD test, the electrostatic charge may be released through the electrostatic discharge layer 310. The orthographic projection of the electrostatic discharge layer 310 on the base substrate 110 at least partially overlaps with the orthographic projection of the driving chip 200 on the base substrate 110. Preferably, the orthographic projection of the driving chip 200 on the base substrate 110 is located within the orthographic projection of the electrostatic discharge layer 310 on the base substrate 110.

Figure 5:
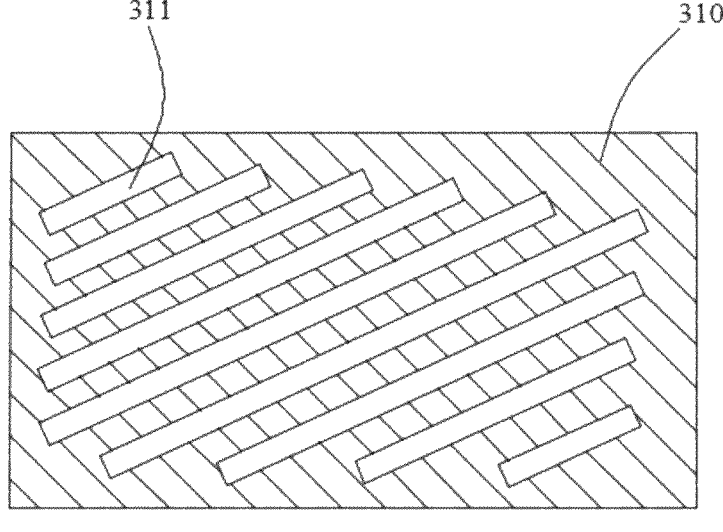
FIG. 5 is a schematic diagram of a structure of an electrostatic discharge layer in an embodiment of the present disclosure.
Figure 7:
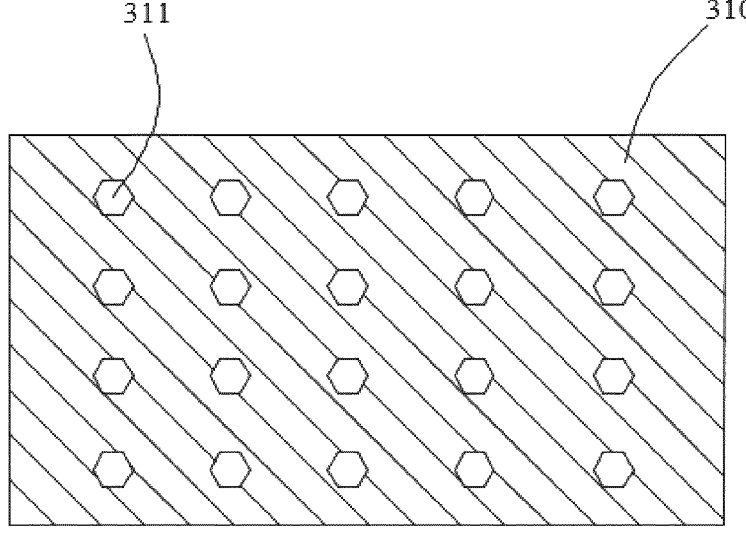
FIG. 7 is a schematic diagram of a structure of an electrostatic discharge layer in another embodiment of the present disclosure.

As shown in FIGS. 2, 5 and 7, in some embodiments of the present disclosure, the electrostatic discharge layer 310 is provided with a first surface 01 close to the flexible substrate 100 and a second surface 02 away from the flexible substrate 100, and a heat dissipation channel 311 running through the first surface 01 and the second surface 02. There is a plurality of heat dissipation channels 311, and the plurality of heat dissipation channels 311 may be arranged according to a certain rule. A shape of orthographic projections of the heat dissipation channels 311 on the flexible substrate 100 may be a circle, an ellipse, a strip, a polygon or an irregular shape, etc., which is not limited in the present disclosure. It should be noted here that the shape or number of heat dissipation channels 311 at different positions of the electrostatic discharge layer 310 may also be different. For example, heat at a center of the driving chip 200 may be relatively concentrated, a heat dissipation area of the heat dissipation channel 311 at the corresponding position may be relatively large, or the number of heat dissipation channels 311 may be relatively more, which may be set according to the actual heat dissipation requirement.

As shown in FIG. 5, in an embodiment of the present disclosure, the orthographic projection of the heat dissipation channel 311 on the flexible substrate 110 is in a shape of a long strip, which may be in a shape of a rectangle. The heat dissipation channel 311 has a long side and a short side, and each heat dissipation channel 311 may be arranged at intervals along an extension direction of the short side. The short side of each heat dissipation channel 311 is roughly equal, and the long side of each heat dissipation channel may be equal or unequal, which may be set according to a size of the electrostatic discharge layer 310.

Figure 6:
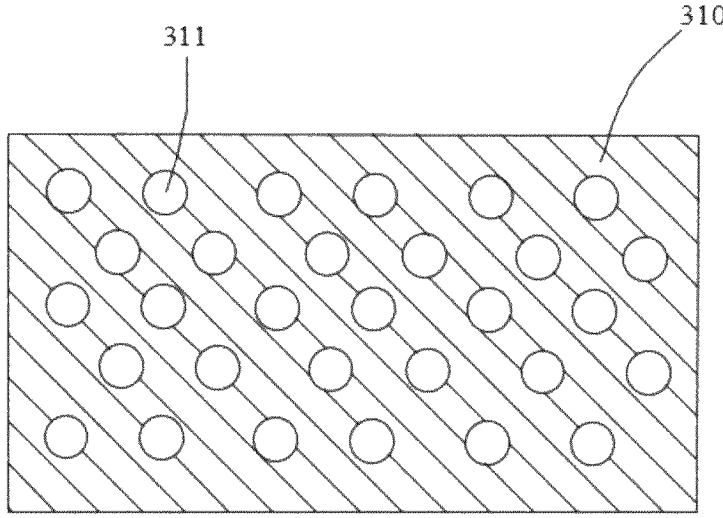
FIG. 6 is a schematic diagram of a structure of an electrostatic discharge layer in another embodiment of the present disclosure.

As shown in FIG. 6, in other embodiments of the present disclosure, a shape of the orthographic projection of the heat dissipation channel 311 on the flexible substrate 100 is a circle, the heat dissipation channels 311 are arranged in an array to form rows and columns, and adjacent two rows or adjacent two rows of heat dissipation channels 311 are staggered. As shown in FIG. 7, in some other embodiments of the present disclosure, a shape of the orthographic projections of the heat dissipation channels 311 on the flexible substrate 100 is a regular polygon, and each heat dissipation channel array is arranged to form a matrix array. It should be noted here that the shape and arrangement of the heat dissipation channel 311 may be various, the above is only an example, which is not limited in the present disclosure.

As shown in FIGS. 8 to 14, in some embodiments of the present disclosure, the electrostatic discharge layer 310 also has a plurality of electrostatic discharge graphic units 312, which may be arranged in an array. The electrostatic discharge graphic unit 312 includes at least two electrostatic discharge sharp corners 3121, and a discharge channel 3122 is defined between the electrostatic discharge sharp corners 3121 and runs through the first surface 01 and the second surface 02. In the present embodiment, the electrostatic discharge sharp corner 3121 has pointy end discharge characteristic. During the ESD test, the electrostatic discharge sharp corner 3121 attracts a large amount of charges, and when the electrostatic discharge sharp corner 3121 gathers a certain amount of charges, an air in the discharge channel 3122 between the electrostatic discharge sharp corners 3121 is ionized, thus rapidly reducing an air resistance between the electrostatic discharge sharp corners 3121, so as to form an air discharge path, and release the charges.

In the present disclosure, there may be a plurality of electrostatic discharge sharp corners 3121 in a single electrostatic discharge graphic unit 312, such as three, four, five, six or more, which is not limited in the present disclosure.

Figure 8:
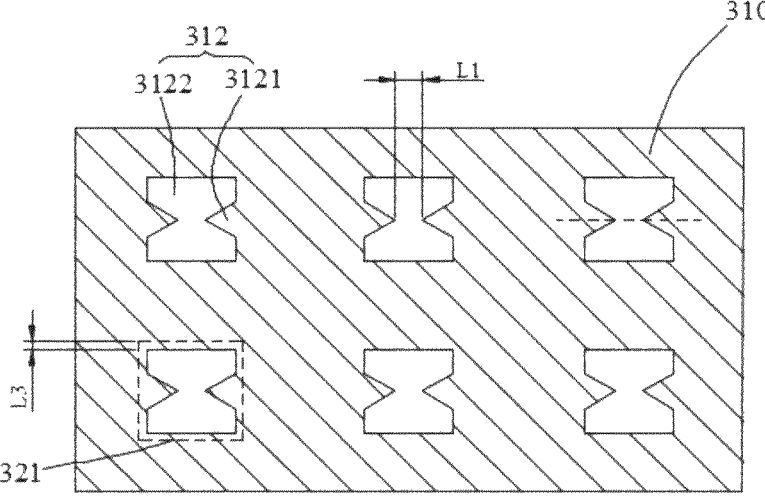
FIG. 8 is a schematic diagram of a structure of an electrostatic discharge layer in another embodiment of the present disclosure.
Figure 9:
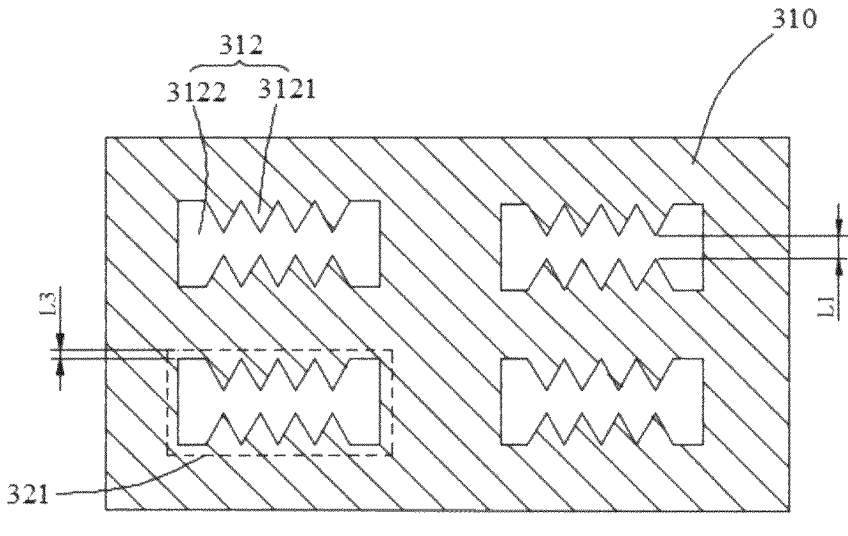
FIG. 9 is a schematic diagram of a structure of an electrostatic discharge layer in another embodiment of the present disclosure.
Figure 10:
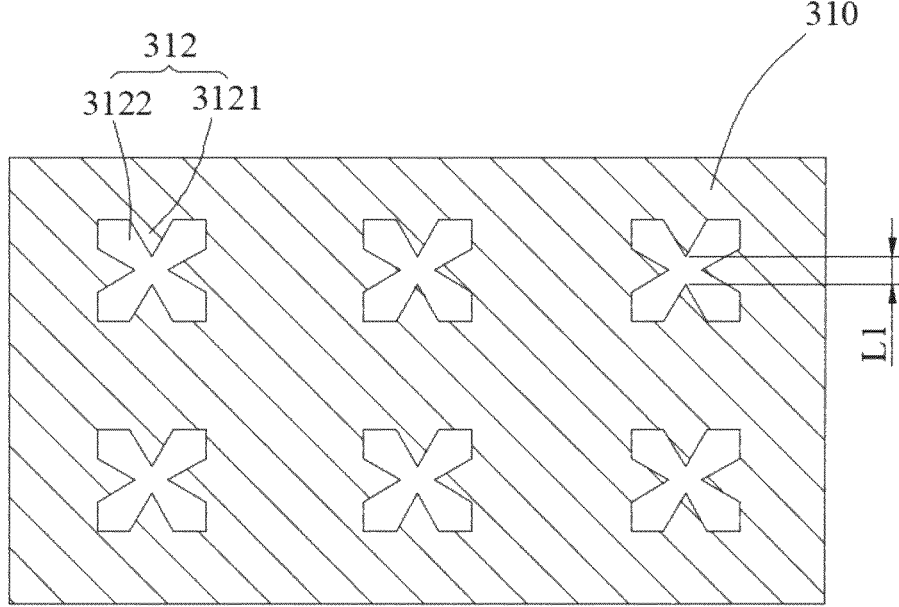
FIG. 10 is a schematic diagram of a structure of an electrostatic discharge layer in another embodiment of the present disclosure.

As shown in FIGS. 8 to 10, in some embodiments of the present disclosure, the electrostatic discharge graphic unit 312 includes an even number of electrostatic discharge sharp corners 3121, and tips of each two electrostatic discharge sharp corners 3121 are arranged opposite each other. For example, as shown in FIG. 8, in an embodiment, the electrostatic discharge graphic unit 312 includes two electrostatic discharge sharp corners 3121, and tips of the two electrostatic discharge sharp corners 3121 are opposite. In the present disclosure, the tip of the electrostatic discharge sharp corner 3121 refers to an apex of the sharp corner. Specifically, an angular bisector of orthographic projections of the two opposite electrostatic discharge sharp corners 3121 on the flexible substrate 100 may be in the same line.

Also as shown in FIG. 9, in another embodiment, two opposite electrostatic discharge sharp corners 3121 form an electrostatic discharge pair, a single electrostatic discharge graphic unit 312 includes a plurality of pairs of electrostatic discharge pairs, and the plurality of electrostatic discharge pairs are arranged sequentially along a specific direction to form a row. For example, a single electrostatic discharge graphic unit 312 includes four pairs of electrostatic discharge pairs, which are arranged along a row direction to form a row. Of course, a single electrostatic discharge graphic unit 312 may also include more pairs of electrostatic discharge pairs, which is not limited in the present disclosure. Moreover, in addition to being arranged sequentially along a specific direction, the electrostatic discharge pairs in the single electrostatic discharge graphic unit 312 may be arranged along different directions, as shown in FIG. 10, the electrostatic discharge graphic unit 312 includes two pairs of electrostatic discharge pairs, where an angular bisector of one pair of electrostatic discharge pairs extends roughly in the row direction, and an angular bisector of the other pair of electrostatic discharge pairs extends roughly in a column direction, i.e., the angular bisectors of the two pairs of electrostatic discharge pairs is roughly perpendicular.

Figure 11:
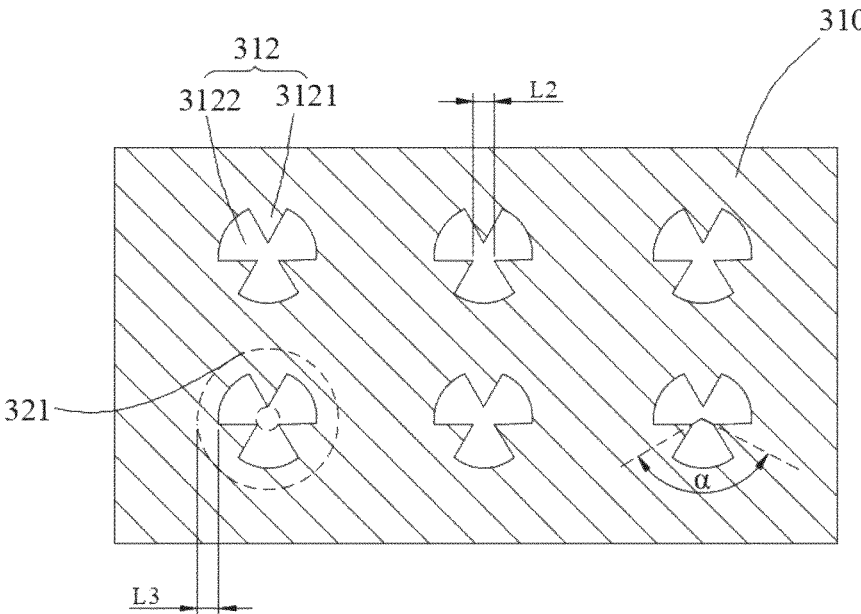
FIG. 11 is a schematic diagram of a structure of an electrostatic discharge layer in another embodiment of the present disclosure.

As shown in FIGS. 11 to 14, in another embodiment of the present disclosure, the electrostatic discharge graphic unit 312 includes a plurality of electrostatic discharge sharp corners 3121, tips of the plurality of electrostatic discharge sharp corners 3121 of the electrostatic discharge graphic unit 312 are connected to form an inner circle, and the plurality of electrostatic discharge sharp corners 3121 of the electrostatic discharge graphic unit 312 are uniformly distributed in a circumferential direction on a periphery of the inner circle. For example, as shown in FIG. 11, the electrostatic discharge graphic unit 312 includes three electrostatic discharge sharp corners 3121, tips of the three electrostatic discharge sharp corners 3121 are connected to form an inner circle, and the three electrostatic discharge sharp corners 3121 are uniformly distributed in a circumferential direction on a periphery of the inner circle. Specifically, the angular bisectors of the orthographic projections of the three electrostatic discharge sharp corners 3121 on the flexible substrate 100 intersect at the same point, which is a center of the inner circle, and an included angle α between two adjacent angular bisectors is roughly 120°.

Figure 12:
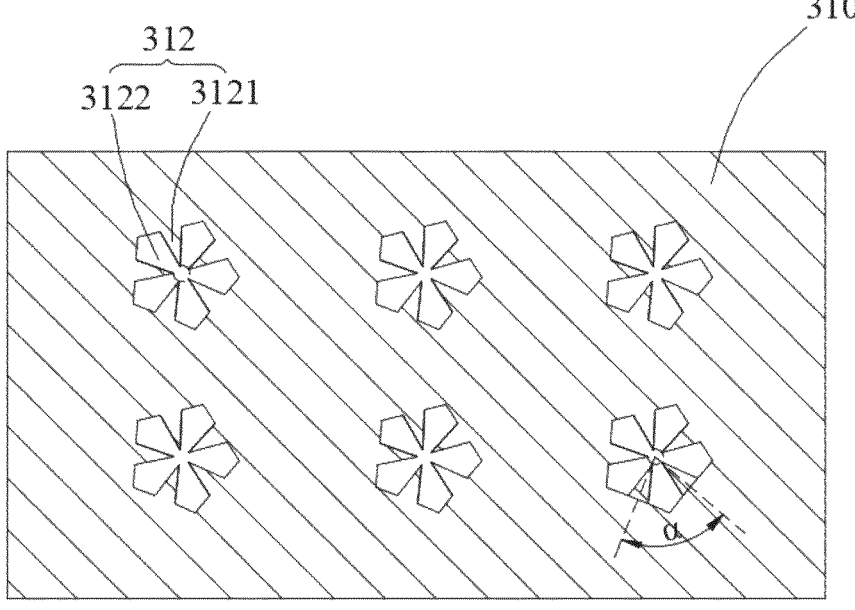
FIG. 12 is a schematic diagram of a structure of an electrostatic discharge layer in another embodiment of the present disclosure.

As shown in FIG. 12, the electrostatic discharge graphic unit 312 includes five electrostatic discharge sharp corners 3121, tips of the five electrostatic discharge sharp corners are connected to form an inner circle, and the five electrostatic discharge sharp corners 3121 are uniformly distributed in a circumferential direction on a periphery of the inner circle. Specifically, the angular bisectors of the orthographic projections of the five electrostatic discharge sharp corners 3121 on the flexible substrate 100 intersect at the same point, which is a center of the inner circle, and an included angle α between two adjacent angular bisectors is roughly 72°.

Figure 13:
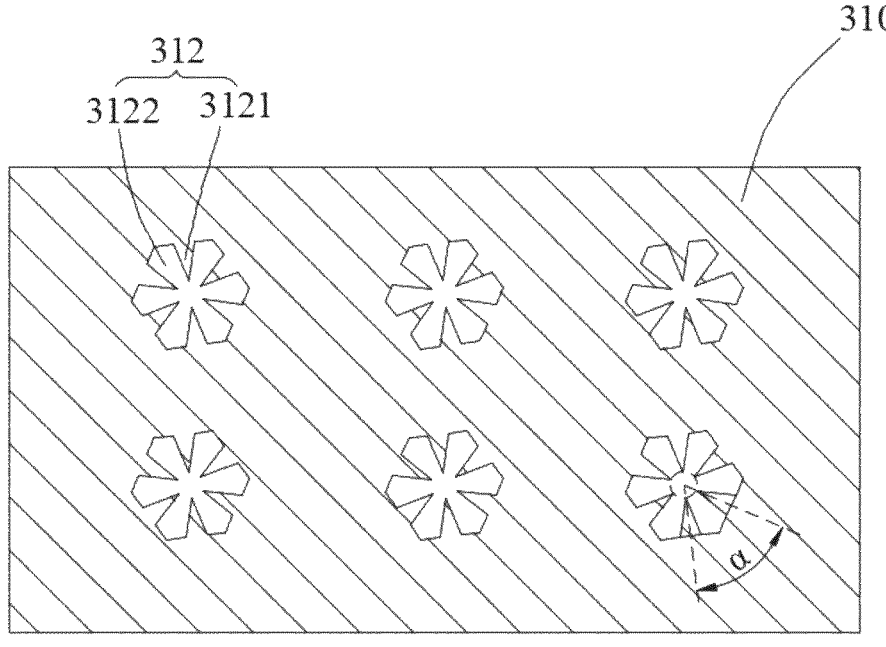
FIG. 13 is a schematic diagram of a structure of an electrostatic discharge layer in another embodiment of the present disclosure.

As shown in FIG. 13, the electrostatic discharge graphic unit 312 includes six electrostatic discharge sharp corners 3121, tips of the six electrostatic discharge sharp corners is connected to form an inner circle, and the six electrostatic discharge sharp corners 3121 are uniformly distributed in a circumferential direction on a periphery of the inner circle. Specifically, the angular bisectors of the orthographic projections of the six electrostatic discharge sharp corners 3121 on the flexible substrate 100 intersect at the same point, which is a center of the inner circle, and an included angle α between two adjacent angular bisectors is roughly 60°.

Figure 14:
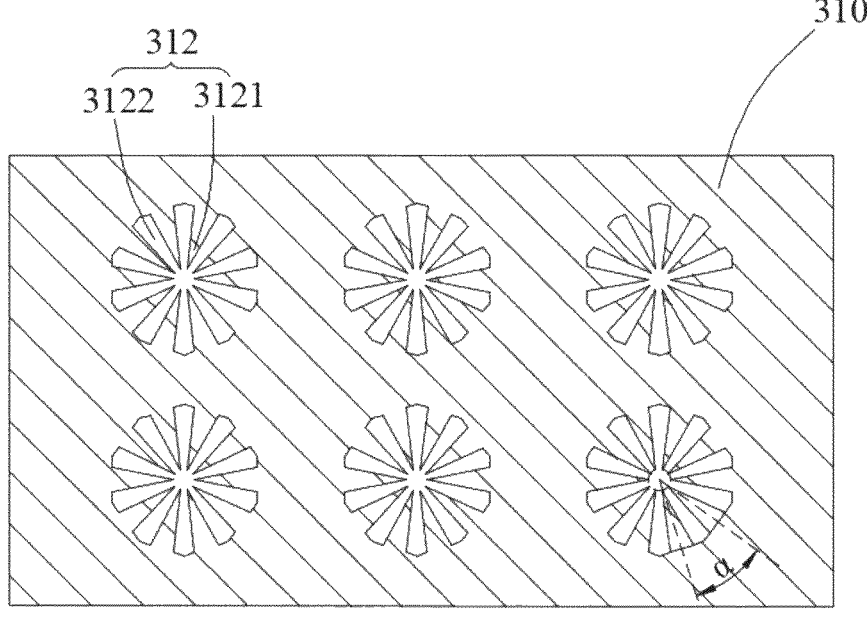
FIG. 14 is a schematic diagram of a structure of an electrostatic discharge layer in another embodiment of the present disclosure.

As shown in FIG. 14, the electrostatic discharge graphic unit 312 includes ten electrostatic discharge sharp corners 3121, tips of the ten electrostatic discharge sharp corners is connected to form an inner circle, and the ten electrostatic discharge sharp corners 3121 are uniformly distributed in a circumferential direction on a periphery of the inner circle. Specifically; the angular bisectors of the orthographic projections of the ten electrostatic discharge sharp corners 3121 on the flexible substrate 100 intersect at the same point, which is a center of the inner circle, and the included angle α between two adjacent angular bisectors is roughly 36°.

The above embodiments are only examples, and the design of the electrostatic discharge graphic unit 312 of the present disclosure is not limited to this. Preferably, the more the number of electrostatic discharge sharp corners 3121 in a single electrostatic discharge graphic unit 312, the better the electrostatic discharge effect.

In some embodiments of the present disclosure, the orthographic projection of the electrostatic discharge sharp corner 3121 on the flexible substrate 100 is an acute angle, which may be 10°, 15°, 20°, 25°, 30°, 35°, 40°, 45°, 50°, 55°, 60°, 65°, 70°, 75°, 80° or 85°, etc. Preferably, the orthographic projection of the electrostatic discharge sharp corner 3121 on the flexible substrate 100 is less than or equal to 60°.

As shown in FIGS. 8 to 14, in some embodiments of the present disclosure, each electrostatic discharge sharp corner 3121 in the electrostatic discharge graphic unit 312 is provided with a tip extending toward an interior of the electrostatic discharge channel 3122, and a distance between tips of two adjacent or opposite electrostatic discharge sharp corners 3121 is 0.05-0.1 mm, which may be 0.05 mm. 0.06 mm. 0.07 mm. 0.08 mm. 0.09 mm. 0.1 mm.

As shown in FIGS. 8 to 10, in the present disclosure, when the electrostatic discharge pattern includes an even number of electrostatic discharge sharp corners 3121, a distance L1 between the tips of the two opposite electrostatic discharge sharp corners 3121 is 0.05-0.1 mm. As shown in FIGS. 11 and 12, when the electrostatic discharge graphic unit 312 includes an odd number of electrostatic discharge sharp corners 3121, a distance L2 between tips of the two adjacent electrostatic discharge sharp corners 3121 is 0.05-0.1 mm. As shown in FIGS. 9 to 14, in some embodiments, the tips of the plurality of electrostatic discharge sharp corners 3121 of the electrostatic discharge graphic unit 312 are connected to form an inner circle with a diameter of 0.05-0.1 mm.

It should be noted that the electrostatic discharge channel 3122 of the present disclosure may also be reused as a heat dissipation channel 311, and heat generated by the driving chip 200 may also be dissipated through the electrostatic discharge channel 3122.

As shown in FIGS. 1 to 3, in some embodiments of the present disclosure, the protective layer 300 also includes a buffer layer 320, which is located on a side of the electrostatic discharge layer 310 away from the flexible substrate 100. The buffer layer 320 may be a structure with good permeability, such as foam, such that the good permeability of the buffer layer 320 may be used to provide a heat dissipation path for the driving chip 200.

As shown in FIG. 2, in some embodiments of the present disclosure, the buffer layer 320 is defined with a through hole 321 running through the buffer layer 320. An orthographic projection of the through hole 321 on the flexible substrate 100 may be in a shape of a circle, an ellipse, a polygon, an irregular polygon, etc., which is not limited in the present disclosure. In the present embodiment, the through hole 321 is defined in the buffer layer 320, which may further provide a heat dissipation path for the driving chip 200, such that the flexible circuit board provided by the present disclosure may meet the heat dissipation requirement of the driving chip 200 while meeting the electrostatic discharge requirement.

As shown in FIG. 8, in some embodiments of the present disclosure, an orthographic projection of the through hole 321 on the flexible substrate 100 at least partially overlaps with an orthographic projection of the discharge channel 3122 on the flexible substrate 100. In the present embodiment, the through hole 321 in the buffer layer 320 may provide air circulation for the electrostatic discharge channel 3122 while having the heat dissipation function, so as to ensure the charge release of the electrostatic discharge sharp corner 3121. In addition, the through hole 321 in the buffer layer 320 may also avoid the burning of the buffer layer 320 caused by the arc or electric spark, and the arc or electric spark is generated by electrostatic discharge sharp corner 3121 due to too violent discharge during the air discharge process. Preferably, a minimum distance between an edge of the orthographic projection of the through hole 321 on the flexible substrate 100 and an edge of the orthographic projection of the discharge channel 3122 on the flexible substrate 100 is greater than or equal to 2 mm. A shape of the through hole 321 may be set according to a shape of the discharge channel 3122. As shown in FIGS. 8 and 9, the through hole 321 is roughly in a shape of rectangle to match the discharge channel 3122 shown in FIG. 8. As shown in FIG. 11, the through hole 321 is roughly in a shape of a circle to match the discharge channel 3122 shown in FIG. 11. Of course, the through hole 321 may also be of other shapes, which is not limited in the present disclosure.

In the present disclosure, the electrostatic discharge may also be implemented through another structure besides the electrostatic discharge graphic unit 312. As shown in FIG. 3, in some other embodiments of the present disclosure, the protective layer 300 also includes an electrostatic discharge column 313, which is connected to a side of the electrostatic discharge layer 310 away from the flexible substrate 100. The electrostatic discharge column 313 is provided with a bottom end close to the flexible substrate 100 and a pointy end away from the flexible substrate 100. Similarly, in the present embodiment, the pointy end of the electrostatic discharge column 313 has the pointy end discharge characteristic. During the ESD test, the pointy end of the electrostatic discharge column 313 attracts a large amount of charges, and the attracted charges may be released through the electrostatic discharge layer 310.

In some embodiments of the present disclosure, an orthographic projection of the pointy end of the electrostatic discharge column 313 on a first plane is an acute angle, and the first plane is perpendicular to the flexible substrate 100. The orthographic projection of the pointy end of the electrostatic discharge column 313 on the first plane may be 10°, 15°, 20°, 25°, 30°, 35°, 40°, 45°, 50°, 55°, 60°, 65°, 70°, 75°, 80° or 85°, etc. Preferably, the orthographic projection of the pointy end of the electrostatic discharge column 313 on the first plane is less than or equal to 60°.

In such the embodiment, the protective layer 300 also includes a buffer layer 320, which is located on a side of the electrostatic discharge layer 310 away from the flexible substrate 100. The buffer layer 320 is defined with an avoidance hole 322 that runs through the buffer layer 320. An orthographic projection of the pointy end of the electrostatic discharge column 313 on the flexible substrate 100 is located within an orthographic projection of the avoidance hole 322 on the flexible substrate 100. In the present embodiment, the avoidance hole 322 may provide an avoidance space for the pointy end of the electrostatic discharge column 313 to avoid the pointy end from burning the buffer layer 320 after the pointy end attracts a large amount of charges. Specifically, a minimum distance between an edge of the orthographic projection of the avoidance hole 322 on the flexible substrate 100 and an edge of an orthographic projection of the bottom end of the electrostatic discharge column 313 on the flexible substrate 100 is greater than or equal 2 mm.

As shown in FIGS. 1 to 3, in some embodiments of the present disclosure, the protective layer 300 also includes a release film 330, which is arranged on a side of the buffer layer 320 away from the flexible substrate 110, and the release film 330 covers a surface of the side of the buffer layer 320 away from the flexible substrate 100.

Figure 4:
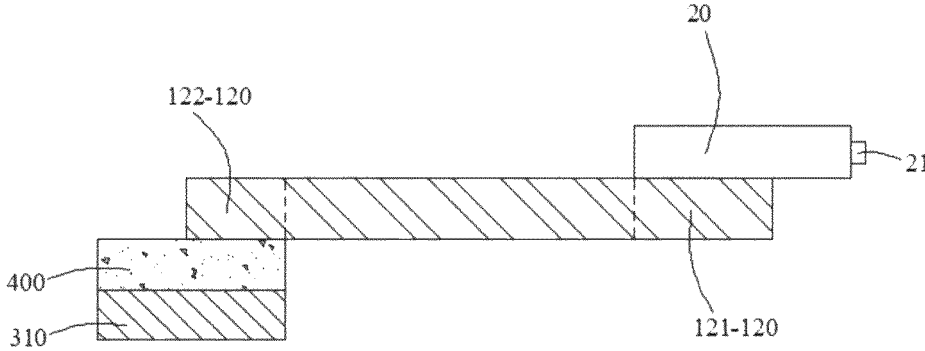
FIG. 4 is a schematic diagram of a connection structure of a conductive layer of a display module in an exemplary embodiment of the present disclosure.

In the present disclosure, in addition to the above embodiments, the electrostatic protective capability of the flexible circuit board may also be improved through other manners. As shown in FIG. 4, in some embodiments of the present disclosure, the conductive layer 120 in the flexible substrate 100 includes a first pin 121 and a second pin 122 connected to each other, the first pin 121 is grounded, and the second pin 122 is configured to be connected with the electrostatic discharge layer 310. In the present embodiment, the electrostatic discharge layer 310 is grounded through the first pin 121 and the second pin 122, so as to enhance the discharge path of the electrostatic discharge layer 310, improve the electrostatic protective capability of the flexible circuit board, and avoid the electrostatic damage to the driving chip 200 during the ESD test. In practical applications, a communication interface of the driving chip 200 may be set at a position of the second pin 122, and an electrostatic protective module, such as magnetic beads and other protective components, may be set in the communication interface, so as to improve a utilization ratio of the conductive layer 120 and reduce the size of the flexible circuit board.

In some embodiments of the present disclosure, the flexible circuit board also includes a conductive adhesive layer 400, which is arranged between the insulating film 130 and the electrostatic discharge layer 310. The electrostatic discharge layer 310 and the second pin 122 are connected through the conductive adhesive layer 400. The conductive adhesive layer 400 may realize the adhesion of the protective layer 300, the driving chip 200 and the flexible substrate 100, and may also complete the connection between the electrostatic discharge layer 310 and the conductive layer 120, so as to improve the discharge path of the electrostatic discharge layer 310.

Figure 15:
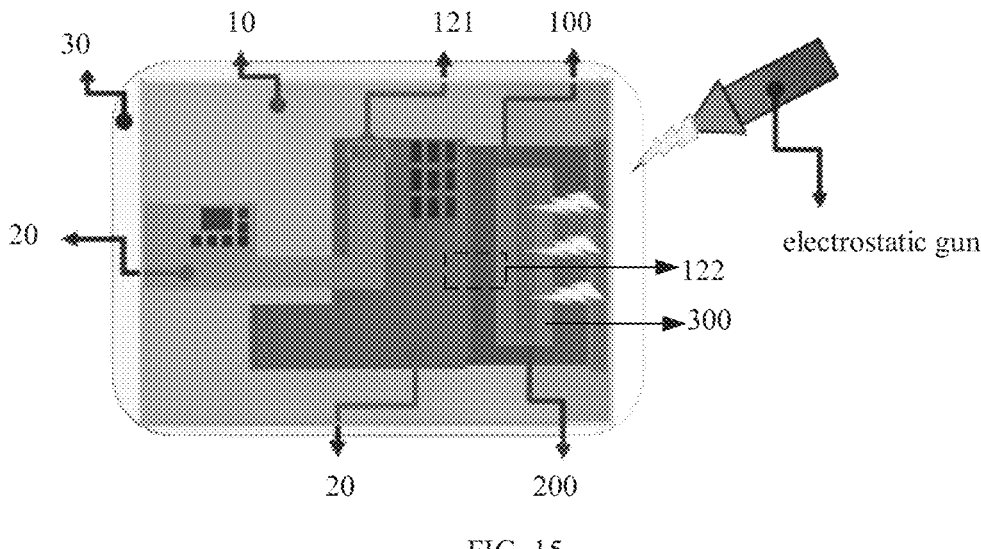
FIG. 15 is a schematic diagram of a display module structure in an exemplary embodiment of the present disclosure.

As shown in FIG. 15, the present disclosure also provides a display module, including a display panel 10, a circuit board 20 and the flexible circuit board in any of the above embodiments. The circuit board 20 of the display module may be FPC. PCB, etc. The first pin 121 is connected to the circuit board 20 provided a ground terminal 21. There may be a plurality of circuit boards 20, such as a touch circuit board and a main circuit board. The conductive layer 120 also includes a third pin, which may be connected to the display panel 10. For example, the display panel 10 may include a plurality of scan lines and data lines, and sub-pixels located in a region defined by the intersection of scan lines and data lines. Each sub-pixel is connected to the scan line and data line through a certain path. The scan line is connected to a scan signal input terminal of the display panel 10, and the data line is connected to a data signal input terminal of the display panel 10. The scan signal input terminal and data signal input terminal of the display panel 10 may be connected to the circuit board 20 through the flexible circuit board of the present disclosure, so as to to transmit the electrical signal on the circuit board 20 to the display panel 10. The display module may also include a cover plate 30 to cover the display panel 10. During the ESD test, the static electricity generated by an electrostatic gun may be released through the electrostatic discharge layer 310, the second pin 122 and the circuit board, so as to increase the charge release path in the flexible circuit board.

The present disclosure also provides a display device, which includes a display module according to any embodiment of the present disclosure. The display device may be a mobile phone, a tablet, a television, a monitor, a laptop, a digital photo frame, a navigator, an electronic watch, a smart bracelet and other product or component.

It should be understood that the present disclosure does not limit its application to the detailed structure and arrangement of components proposed in the specification. The present disclosure has other embodiments, and the embodiments may be implemented and executed in various ways. The deformations and modifications are within the protection scope defined by the claims of the embodiments of the present disclosure and equivalent technologies, and do not depart from the spirit and scope of the embodiments of the present disclosure. It should be understood that the present disclosure disclosed in this specification extends to all alternative combinations of two or more individual features mentioned in the specification and/or drawings. All these different combinations constitute multiple alternative aspects of the present disclosure. The embodiments described in this specification illustrate the best way known for implementing the present disclosure, and those skilled in the art may utilize the present disclosure.

What is claimed is:

1. A flexible circuit board, comprising:
a flexible substrate having a chip binding region;
a driving chip, arranged in the chip binding region of the flexible substrate; and
a protective layer, arranged on a side of the driving chip away from the flexible substrate, wherein the protective layer comprises an electrostatic discharge layer, an orthographic projection of the electrostatic discharge layer on the flexible substrate at least partially overlaps with an orthographic projection of the driving chip on the flexible substrate;
wherein the electrostatic discharge layer is provided with a first surface close to the flexible substrate, a second surface far away from the flexible substrate, and a plurality of electrostatic discharge graphic units, each of the plurality of the electrostatic discharge graphic units comprises at least two electrostatic discharge sharp corners, and a discharge channel is defined between the electrostatic discharge sharp corners and runs through the first surface and the second surface.

2. The flexible circuit board according to claim 1, wherein the electrostatic discharge layer is provided with a heat dissipation channel running through the first surface and the second surface.

3. The flexible circuit board according to claim 1, wherein the electrostatic discharge graphic unit comprises an even number of the electrostatic discharge sharp corners, and tips of each two electrostatic discharge sharp corners are arranged opposite each other.

4. The flexible circuit board according to claim 1, wherein the electrostatic discharge graphic unit comprises a plurality of electrostatic discharge sharp corners, tips of the plurality of electrostatic discharge sharp corners of the electrostatic discharge graphic unit are connected to form an inner circle, and the plurality of electrostatic discharge sharp corners of the electrostatic discharge graphic unit are uniformly distributed in a circumferential direction on a periphery of the inner circle.

5. The flexible circuit board according to claim 1, wherein each electrostatic discharge sharp corner in the electrostatic discharge graphic unit is provided with a tip extending toward an interior of the discharge channel, and a distance between tips of two adjacent or opposite electrostatic discharge sharp corners is 0.05 to 0.1 mm.

6. The flexible circuit board according to claim 1, wherein an orthographic projection of the electrostatic discharge sharp corner on the flexible substrate is an acute angle.

7. The flexible circuit board according to claim 1, wherein the protective layer further comprises:
a buffer layer, arranged on a side of the electrostatic discharge layer away from the flexible substrate, wherein the buffer layer is defined with a through hole running through the buffer layer, an orthographic projection of the through hole on the flexible substrate and an orthographic projection of the discharge channel on the flexible substrate at least partially overlap.

8. The flexible circuit board according to claim 7, wherein a minimum distance between an edge of the orthographic projection of the through hole on the flexible substrate and an edge of the orthographic projection of the discharge channel on the flexible substrate is greater than or equal to 2 mm.

9. The flexible circuit board according to claim 1, wherein the protective layer further comprises:
an electrostatic discharge column, connected to a side of the electrostatic discharge layer away from the flexible substrate, wherein the electrostatic discharge column is provided with a bottom end close to the flexible substrate and a pointy end away from the flexible substrate.

10. The flexible circuit board according to claim 9, wherein an orthographic projection of the pointy end of the electrostatic discharge column on a first plane is an acute angle, and the first plane is perpendicular to the flexible substrate.

11. The flexible circuit board according to claim 9, wherein the protective layer further comprises:
a buffer layer, arranged on a side of the electrostatic discharge layer away from the flexible substrate, wherein the buffer layer is defined with an avoidance hole running through the buffer layer, an orthographic projection of the pointy end of the electrostatic discharge column on the flexible substrate is located within an orthographic projection of the avoidance hole on the flexible substrate.

12. The flexible circuit board according to claim 11, wherein a minimum distance between an edge of the orthographic projection of the avoidance hole on the flexible substrate and an edge of an orthographic projection of the bottom end of the electrostatic discharge column on the flexible substrate is greater than or equal to 2 mm.

13. The flexible circuit board according to claim 1, wherein the flexible substrate comprises:
a base substrate;
a conductive layer, arranged on a side of the base substrate close to the protective layer, wherein the conductive layer comprises a first pin and a second pin connected to each other, the first pin is grounded, and the second pin is configured to be connected to the electrostatic discharge layer; and
an insulating film, arranged on a side of the conductive layer away from the base substrate, wherein the insulating film is located on a periphery of the driving chip.

14. The flexible circuit board according to claim 13, further comprising:
a conductive adhesive layer, arranged between the insulating film and the electrostatic discharge layer, and the electrostatic discharge layer and the second pin are connected through the conductive adhesive layer.

15. The flexible circuit board according to claim 7, wherein the protective layer further comprises:
a release film, arranged on a side of the buffer layer away from the flexible substrate, wherein the release film covers a surface of the side of the buffer layer away from the flexible substrate.

16. The flexible circuit board according to claim 11, wherein the protective layer further comprises:
a release film, arranged on a side of the buffer layer away from the flexible substrate, wherein the release film covers a surface of the side of the buffer layer away from the flexible substrate.

17. A display module, comprising a display panel, a circuit board and a flexible circuit board, wherein the flexible circuit board comprises:
a flexible substrate having a chip binding region;
a driving chip, arranged in the chip binding region of the flexible substrate; and
a protective layer, arranged on a side of the driving chip away from the flexible substrate, wherein the protective layer comprises an electrostatic discharge layer, an orthographic projection of the electrostatic discharge layer on the flexible substrate at least partially overlaps with an orthographic projection of the driving chip on the flexible substrate;

wherein the electrostatic discharge layer is provided with a first surface close to the flexible substrate, a second surface far away from the flexible substrate, and a plurality of electrostatic discharge graphic units, each of the plurality of the electrostatic discharge graphic units comprises at least two electrostatic discharge sharp corners, and a discharge channel is defined between the electrostatic discharge sharp corners and runs through the first surface and the second surface.

18. The display module according to claim 17, wherein the electrostatic discharge layer is provided with a heat dissipation channel running through the first surface and the second surface.

19. A display module, comprising a display panel, a circuit board and a flexible circuit board; wherein the flexible circuit board comprises:

a flexible substrate having a chip binding region;

a driving chip, arranged in the chip binding region of the flexible substrate; and a protective layer, arranged on a side of the driving chip away from the flexible substrate, wherein the protective layer comprises an electrostatic discharge layer, an orthographic projection of the electrostatic discharge layer on the flexible substrate at least partially overlaps with an orthographic projection of the driving chip on the flexible substrate;

wherein the flexible substrate comprises:

a base substrate;

a conductive layer, arranged on a side of the base substrate close to the protective layer;

wherein the conductive layer comprises a first pin and a second pin connected to each other, the first pin is grounded, and the second pin is configured to be connected to the electrostatic discharge layer; and an insulating film, arranged on a side of the conductive layer away from the base substrate, wherein the insulating film is located on a periphery of the driving chip;

wherein the first pin is connected to the circuit board, and the circuit board is provided with a ground end;

the conductive layer further comprises a third pin connected to the display panel.

\* \* \* \* \*